US010861829B2

(12) United States Patent
Fung et al.

(10) Patent No.: US 10,861,829 B2
(45) Date of Patent: Dec. 8, 2020

(54) SENSOR SYSTEM

(71) Applicant: ILLUMINA, INC., San Diego, CA (US)

(72) Inventors: Tracy Helen Fung, San Mateo, CA (US); Hai Quang Tran, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 0 days.

(21) Appl. No.: 16/609,554

(22) PCT Filed: Dec. 26, 2017

(86) PCT No.: PCT/US2017/068397
§ 371 (c)(1),
(2) Date: Oct. 30, 2019

(87) PCT Pub. No.: WO2019/132857
PCT Pub. Date: Jul. 4, 2019

(65) Prior Publication Data
US 2020/0066684 A1 Feb. 27, 2020

(51) Int. Cl.
*G01N 21/64* (2006.01)
*H01L 25/065* (2006.01)
(Continued)

(52) U.S. Cl.
CPC ...... *H01L 25/0657* (2013.01); *H01L 23/3135* (2013.01); *H01L 24/29* (2013.01);
(Continued)

(58) Field of Classification Search
CPC ..... H01L 25/0657; H01L 24/91; H01L 24/45; H01L 24/29; H01L 23/3135;
(Continued)

(56) References Cited

U.S. PATENT DOCUMENTS

| 4,755,667 A | 7/1988 | Marsoner |
| 5,605,662 A | 2/1997 | Heller et al. |

(Continued)

FOREIGN PATENT DOCUMENTS

| CN | 103066081 | 4/2013 |
| CN | 105006478 | 10/2015 |

(Continued)

OTHER PUBLICATIONS

International Search Report and Written Opinion of the International Searching Authority for International Application No. PCT/US2017/068397 dated Dec. 5, 2018.

(Continued)

*Primary Examiner* — Bitew A Dinke
(74) *Attorney, Agent, or Firm* — Illumina, Inc.

(57) ABSTRACT

A system includes an image sensor structure and a flow cell. The image sensor structure includes an image layer disposed over a base substrate. A device stack is disposed over the image layer. A bond pad is disposed in the device stack. A passivation stack is disposed over the device stack and the bond pad. An array of nanowells is disposed in a top layer of the passivation stack. A through-silicon via (TSV) is in electrical contact with the bond pad. The TSV extends through the base substrate. A redistribution layer (RDL) is disposed on a bottom surface of the base substrate. The RDL is in electrical contact with the TSV. The flow cell is disposed upon the top layer of the passivation stack to form a flow channel therebetween. The flow channel is disposed over the array of nanowells and the bond pad.

19 Claims, 14 Drawing Sheets

(51) Int. Cl.
  *H01L 23/31* (2006.01)
  *H01L 23/00* (2006.01)
(52) U.S. Cl.
  CPC .............. *H01L 24/45* (2013.01); *H01L 24/91* (2013.01); *H01L 2224/02372* (2013.01); *H01L 2225/06541* (2013.01)
(58) Field of Classification Search
  CPC . H01L 2225/06541; H01L 2224/02372; H01L 23/481; H01L 27/146; H01L 23/48; H01L 23/00; G01N 21/6454; G01N 21/00; G01N 21/6428; G01N 33/53; G01N 2201/08; G01N 2021/6471; G01N 21/6486; G01N 21/6402; G01N 21/01
  See application file for complete search history.

(56) References Cited

U.S. PATENT DOCUMENTS

| | | |
|---|---|---|
| 5,653,939 A | 8/1997 | Hollis et al. |
| 5,672,881 A | 9/1997 | Striepe |
| 5,843,767 A | 12/1998 | Beattie |
| 5,846,708 A | 12/1998 | Hollis et al. |
| 5,854,684 A | 12/1998 | Stabile et al. |
| 5,872,623 A | 2/1999 | Stabile |
| 5,894,351 A | 4/1999 | Colvin |
| 5,942,775 A | 8/1999 | Yiannoulos |
| 5,965,452 A | 10/1999 | Kovacs |
| 6,111,248 A | 8/2000 | Melendez |
| 6,117,643 A | 9/2000 | Simpson |
| 6,122,042 A | 9/2000 | Wunderman |
| 6,197,503 B1 | 3/2001 | Vo Dinh |
| 6,317,207 B2 | 11/2001 | French |
| 6,323,944 B1 | 11/2001 | Xiao |
| 6,327,410 B1 | 12/2001 | Walt et al. |
| 6,403,970 B1 | 6/2002 | Hung |
| 6,440,722 B1 | 8/2002 | Knapp et al. |
| 6,441,892 B2 | 8/2002 | Xioa |
| 6,448,064 B1 | 9/2002 | Vo-Dinh et al. |
| 6,458,547 B1 | 10/2002 | Bryan et al. |
| 6,469,785 B1 | 10/2002 | Duveneck |
| 6,485,905 B2 | 11/2002 | Hefti |
| 6,566,805 B1 | 5/2003 | Tsai |
| 6,653,083 B2 * | 11/2003 | Emoto ................. C12Q 1/6825 435/287.2 |
| 6,686,150 B1 | 2/2004 | Blackburn et al. |
| 6,693,269 B2 | 2/2004 | Shimizu |
| 6,743,581 B1 | 6/2004 | Vo Dinh |
| 6,784,982 B1 | 8/2004 | Blumenfeld |
| 6,844,563 B2 | 1/2005 | Emoto |
| 6,867,420 B2 | 3/2005 | Mathies |
| 6,867,851 B2 | 3/2005 | Blumenfeld et al. |
| 6,899,137 B2 | 5/2005 | Unger |
| 6,905,834 B1 | 6/2005 | Simpson |
| 6,921,908 B2 | 7/2005 | Reel |
| 6,940,590 B2 | 9/2005 | Colvin |
| 6,946,286 B2 | 9/2005 | Howard |
| 6,975,251 B2 | 12/2005 | Pavicic |
| 6,982,519 B2 | 1/2006 | Guillorn |
| 6,995,386 B2 | 2/2006 | Emoto |
| 7,005,264 B2 | 2/2006 | Su |
| 7,013,033 B2 | 3/2006 | Arena |
| 7,075,104 B2 | 7/2006 | Fads |
| 7,145,645 B2 | 12/2006 | Blumenfeld |
| 7,163,822 B2 | 1/2007 | Yazawa |
| 7,170,605 B2 | 1/2007 | Cromwell |
| 7,179,654 B2 | 2/2007 | Verdonk |
| 7,190,445 B2 | 3/2007 | Colvin |
| 7,221,455 B2 | 5/2007 | Chediak |
| 7,244,559 B2 | 7/2007 | Rothberg et al. |
| 7,258,731 B2 | 8/2007 | D'Urso |
| 7,280,201 B2 | 10/2007 | Helbing |
| 7,308,292 B2 | 12/2007 | Colvin |
| 7,349,093 B2 | 3/2008 | Tabata |
| 7,371,538 B2 | 5/2008 | Simpson |
| 7,371,564 B2 | 5/2008 | Kwon |
| 7,413,852 B2 | 8/2008 | Balch |
| 7,416,915 B2 | 8/2008 | Kasano |
| 7,433,552 B2 | 10/2008 | Kiesel |
| 7,454,296 B2 | 11/2008 | Wang |
| 7,463,353 B2 | 12/2008 | Yershov |
| 7,466,409 B2 | 12/2008 | Scherer |
| 7,489,401 B2 | 2/2009 | Kamei |
| 7,502,123 B2 | 3/2009 | Schmidt |
| 7,524,459 B2 | 4/2009 | Adams |
| 7,541,176 B2 | 6/2009 | Raynor |
| 7,585,664 B2 | 9/2009 | Chan |
| 7,595,883 B1 | 9/2009 | El Gamal et al. |
| 7,604,981 B1 | 10/2009 | Harris |
| 7,609,379 B2 | 10/2009 | Canioni |
| 7,629,591 B2 | 12/2009 | Nelson |
| 7,638,182 B2 | 12/2009 | D'Urso |
| 7,738,086 B2 | 6/2010 | Shepard |
| 7,750,354 B2 | 7/2010 | Kasano |
| 7,767,441 B2 | 8/2010 | Chiou |
| 7,782,237 B2 | 8/2010 | Ronaghi |
| 7,811,810 B2 | 10/2010 | Chiou |
| 7,812,324 B2 | 10/2010 | Connally |
| 7,839,450 B2 | 11/2010 | Hing |
| 8,906,320 B1 * | 12/2014 | Eltoukhy ............ G01N 21/6486 422/417 |
| 9,372,308 B1 * | 6/2016 | Saxena ................ B29D 17/007 |
| 9,373,732 B2 | 6/2016 | Velichko et al. |
| 9,799,697 B2 | 10/2017 | Lee et al. |
| 10,551,317 B2 * | 2/2020 | Fung ................... G01N 21/6428 |
| 10,649,145 B2 * | 5/2020 | Cai ........................ G02B 5/20 |
| 2003/0108867 A1 | 6/2003 | Chee et al. |
| 2007/0034777 A1 | 2/2007 | Tuckerman et al. |
| 2007/0146704 A1 | 6/2007 | Schmidt |
| 2007/0281288 A1 | 12/2007 | Belkin |
| 2008/0039339 A1 | 2/2008 | Hassibi |
| 2008/0081769 A1 | 4/2008 | Hassibi |
| 2008/0176757 A1 | 7/2008 | Hassibi |
| 2008/0203452 A1 | 8/2008 | Moon |
| 2009/0075838 A1 | 3/2009 | El Gamal et al. |
| 2009/0197326 A1 | 8/2009 | El Gamal |
| 2009/0258413 A1 | 10/2009 | Moriwaki |
| 2009/0279093 A1 | 11/2009 | Van Herpen |
| 2009/0284746 A1 | 11/2009 | Klunder |
| 2009/0325164 A1 | 12/2009 | Vossenaar |
| 2010/0015611 A1 | 1/2010 | Webster |
| 2010/0055666 A1 | 3/2010 | Wimberger-Friedl |
| 2010/0065726 A1 | 3/2010 | Zhong |
| 2010/0108865 A1 | 5/2010 | Cho |
| 2010/0111762 A1 | 5/2010 | Cho |
| 2010/0112342 A1 | 5/2010 | Cho |
| 2010/0122904 A1 | 5/2010 | Hassibi |
| 2010/0200781 A1 | 8/2010 | Khorasani |
| 2010/0204064 A1 * | 8/2010 | Cho ................... G01N 21/6454 506/17 |
| 2010/0210475 A1 | 8/2010 | Lee |
| 2010/0230610 A1 | 9/2010 | Van Der Zaag |
| 2012/0021525 A1 | 1/2012 | Fehr et al. |
| 2012/0193744 A1 * | 8/2012 | Borthakur ......... H01L 27/14636 257/443 |
| 2013/0069188 A1 | 3/2013 | Chen et al. |
| 2013/0307103 A1 * | 11/2013 | Lin ................... H01L 27/14632 257/432 |
| 2014/0084407 A1 * | 3/2014 | Churchwell ...... H01L 27/14609 257/443 |
| 2014/0225166 A1 * | 8/2014 | Ellis-Monaghan ........................ G01N 27/414 257/253 |
| 2014/0264698 A1 * | 9/2014 | Huang .............. H01L 27/14634 257/433 |
| 2015/0054106 A1 | 2/2015 | Chen et al. |
| 2015/0062420 A1 * | 3/2015 | Borthakur ............ H04N 5/2253 348/373 |
| 2015/0079596 A1 | 3/2015 | Eltoukhy et al. |
| 2015/0300139 A1 | 10/2015 | Arsenin et al. |
| 2015/0311376 A1 | 10/2015 | Yu |

(56) References Cited

U.S. PATENT DOCUMENTS

| | | | | |
|---|---|---|---|---|
| 2015/0318323 | A1* | 11/2015 | Borthakur | H01L 27/14623 348/273 |
| 2016/0181226 | A1* | 6/2016 | Wan | G01S 17/08 348/164 |
| 2016/0254312 | A1 | 9/2016 | Lee et al. | |
| 2016/0356715 | A1* | 12/2016 | Zhong | B01L 3/502707 |
| 2017/0016830 | A1 | 1/2017 | Chung et al. | |
| 2017/0144155 | A1* | 5/2017 | Bohm | G01N 35/08 |
| 2017/0200697 | A1* | 7/2017 | Kao | H01L 25/0657 |
| 2018/0097028 | A1* | 4/2018 | Kinsman | H01L 27/14621 |
| 2018/0240797 | A1* | 8/2018 | Yokoyama | H01L 27/0886 |
| 2019/0088463 | A1* | 3/2019 | Li | G01N 21/05 |
| 2019/0195797 | A1* | 6/2019 | Cai | G01N 21/6454 |
| 2019/0198553 | A1* | 6/2019 | Cai | G01J 1/44 |
| 2020/0066684 | A1* | 2/2020 | Fung | H01L 23/481 |
| 2020/0091217 | A1* | 3/2020 | Horikoshi | H01L 21/76898 |
| 2020/0164360 | A1* | 5/2020 | Rival | G01N 21/6428 |
| 2020/0166461 | A1* | 5/2020 | Fung | G01N 21/6428 |

FOREIGN PATENT DOCUMENTS

| | | |
|---|---|---|
| CN | 105980832 | 9/2016 |
| CN | 106353285 | 1/2017 |
| CN | 106471621 | 3/2017 |
| CN | 107265391 | 10/2017 |
| JP | 2015-222810 | 12/2015 |
| JP | 2017504789 | 2/2017 |
| RU | 2527699 | 9/2014 |
| TW | 200727466 | 7/2007 |
| WO | 1998/029736 | 7/1998 |
| WO | 2000/004372 | 1/2000 |
| WO | 2012/058096 | 5/2012 |

OTHER PUBLICATIONS

Burns et al., "Microfabricated Structures for Integrated DNA Analysis" Proc. Natl. Acad. Sci. vol. 93, 5556-5561, May 1996.
Caillat et al., "SA 17.1: Active CMOS Biochips: An Electro-Addressed DNA Probe" IEEE International Solid-State Circuits Conference, Digest of Technical Papers, ISSCC, First Edition, 1998.
Caillat et al., "Biochips on CMOS: An Active Matrix Address Array for DNA Analysis" Sensors and Actuators B 61, 154-162, 1999.
Downs, M., "Prospects for Nucleic Acid Biosensors" Biosensors, Biochemical Society Transactions, vol. 19, 1991.
Eggers, et al., "A Microchip for Quantitative Detection of Molecules Utilizing Luminescent and Radioisotope Reporter Groups" BioTechniques, vol. 17 (3) 516-524,1994.
Eggers, et al., "A Review of Microfabricated Devices for Gene-Based Diagnostics" Hematologic Pathology, 9 (1), 1-15, 1995.
Eggers, M. et al., "A Versatile Biochip for Gene-Based Diagnostics" Professional Program Proceedings, ELECTRO'96, IEEE, 87-92, 1996.
Kunz, R., "Miniature Integrated Optical Modules for Chemical and Biochemical Sensing" Sensors and Actuators B 38-39, 13-28, 1997.
Kunz, R., "Totally Integrated Optical Measuring Sensors" SPIE vol. 1587 Chemical, Biochemical, and Environmental Fiber Sensors III, 98-113, 1991.
Lamture et al., "Direct Detection of Nucleic Acid Hybridization on the Surface of a Charge Coupled-Device" Nucleic Acids Research, 22 (11), 2121-2125, 1994.
Leamon et al., "Cramming More Sequencing Reactions onto Microreactor Chips" Chem. Rev., vol. 107, 3367-3376, Jul. 2007.
Marguiles, et al., "Genome Sequencing in Open Microfabricated High Density Picoliter Reactors" Nature 437, 376-380, Jul. 2005.
Mastrangelo et al., "Microfabricated Devices for Genetic Diagnostics" Proceedings of the IEEE, vol. 8 (8), 1769-1787, Aug. 1998.
Schmalzing et al., "DNA Typing in Thirty Seconds with a Microfabricated Device" Proc. Natl. Acad. Sci,, vol. 9, 10273-10278, Sep. 1997.
Vo-Dinh, etal.,"DNA Biochip Using a Phototransistor Integrated Circuit" Anal. Chem., 71, 358-363, Jan. 1999.

* cited by examiner

SENSOR SYSTEM

CROSS REFERENCE TO RELATED APPLICATION

This application is the National Phase filing under 35 U.S.C. § 371 of International Application No.: PCT/US2017/068397, filed on Dec. 26, 2017, and published on Jul. 4, 2019 as WO 2019/132857. The entire contents of WO 2019/132857 is hereby incorporated herein by reference in its entirety.

BACKGROUND

A sensor system, for example a biosensor system, may include a flow cell disposed on a top layer of a passivation stack of layers (herein the "passivation stack") of an image sensor structure, wherein the flow cell and the passivation stack form a flow channel therebetween. Such sensor systems often utilize high density arrays of nanowells disposed in the top layer of the passivation stack, and within the flow channel of the flow cell, to perform controlled reaction protocols on analytes disposed within the nanowells.

In an example of such a reaction protocol, analytes (such as clusters of DNA segments, nucleic-acid molecular chains, or the like) that are disposed in a nanowell array of an image sensor structure may be tagged with an identifiable label (such as a fluorescently labeled molecule) that is delivered to the analytes via fluid flow through the flow channel. One or more excitation lights can then be directed onto the labeled analytes within the nanowells. The analytes may then emit photons of an emissive light, which may be transmitted through the passivation stack and into light guides of the image sensor structure that are associated (e.g., located directly below) with each nanowell.

A top surface of each light guide is in direct contact with the bottom surface of the passivation stack, wherein each light guide's top surface receives a significant portion of the emissive light photons transmitted from its associated nanowell. The light guides direct the emissive light photons to light detectors disposed within the image sensor structure and associated (e.g., located directly below) with the light guides. The light detectors detect the emissive light photons. Device circuitry within the image sensor structure then processes and transmits data signals using those detected photons. The data signals may then be analyzed to reveal properties of the analytes. Examples of such reaction protocols include high-throughput DNA sequencing for the health and pharmaceutical industries and more.

As the need for increasing the data throughput generated from such reaction protocols continuously grows, so does the need to continuously reduce the size of nanowells in nanowell arrays in an image sensor structure and increase the number of nanowells in the nanowell arrays. Additionally, as the need to reduce the size and increase the number of nanowells grows, it becomes increasingly more critical that surface chemistry, required to prepare for and conduct such chemical reactions, be compatible with electronic components (such as bond pads) within the sensor system.

BRIEF DESCRIPTION

The present disclosure offers advantages and alternatives over the prior art by providing a sensor system, such as, for example, a biosensor system, including bond pads disposed under a passivation stack of an image sensor system. Because the bond pads are protected by the passivation stack, the flow channel area of the sensor system is no longer restricted by the bond pads and may be enlarged such that it is disposed over the bond pads as well as the nanowells. Accordingly, the number of nanowells that can fit under the flow channel for an image sensor structure having a fixed footprint can be increased.

A system in accordance with one or more aspects of the present disclosure includes an image sensor structure and a flow cell. The image sensor structure includes an image layer disposed over a base substrate. A device stack is disposed over the image layer. A bond pad is disposed in the device stack. A passivation stack is disposed over the device stack and the bond pad. An array of nanowells is disposed in a top layer of the passivation stack. A through-silicon via (TSV) is in electrical contact with the bond pad. The TSV extends through the base substrate. A redistribution layer (RDL) is disposed on a bottom surface of the base substrate. The RDL is in electrical contact with the TSV. The flow cell is disposed upon the top layer of the passivation stack to form a flow channel therebetween. The flow channel is disposed over the array of nanowells and the bond pad.

Another system in accordance with one or more aspects of the present disclosure includes a flow cell and an image sensor structure. The image sensor structure includes an image layer disposed over a base substrate. The image layer includes an array of light detectors disposed therein. A device stack is disposed over the image layer. A plurality of bond pads is disposed in the device stack. An array of light guides is disposed in the device stack. A passivation stack is disposed over the device stack and the plurality of bond pads. An array of nanowells is disposed in a top layer of the passivation stack. A through-silicon via (TSV) is in electrical contact with the bond pads of the plurality of bond pads. The TSV extends through the base substrate. A redistribution layer (RDL) is disposed on a bottom surface of the base substrate. The RDL is in electrical contact with the TSV. A flow cell is disposed upon the top layer of the passivation stack to form a flow channel therebetween. The flow channel is disposed over the array of nanowells and the plurality of bond pads.

A method in accordance with one or more aspects of the present disclosure includes disposing a device stack and an image layerover a base substrate layer. A bond pad is disposed in the device stack. A passivation stack is disposed over the device stack and the bond pad. An array of nanowells is formed in a top layer of the passivation stack. A TSV is etched through a bottom surface of the base substrate. The TSV extends to the bond pad. The TSV is plated to make electrical contact with the bond pad. An RDL is disposed on the bottom surface of the base substrate. The RDL is in electrical contact with the TSV. A flow cell is disposed upon the top layer of the passivation stack to form a flow channel therebetween. The flow channel is disposed over the array of nanowells and the bond pad.

DRAWINGS

The disclosure will be more fully understood from the following detailed description taken in conjunction with the accompanying drawings, in which.

Figure 12:
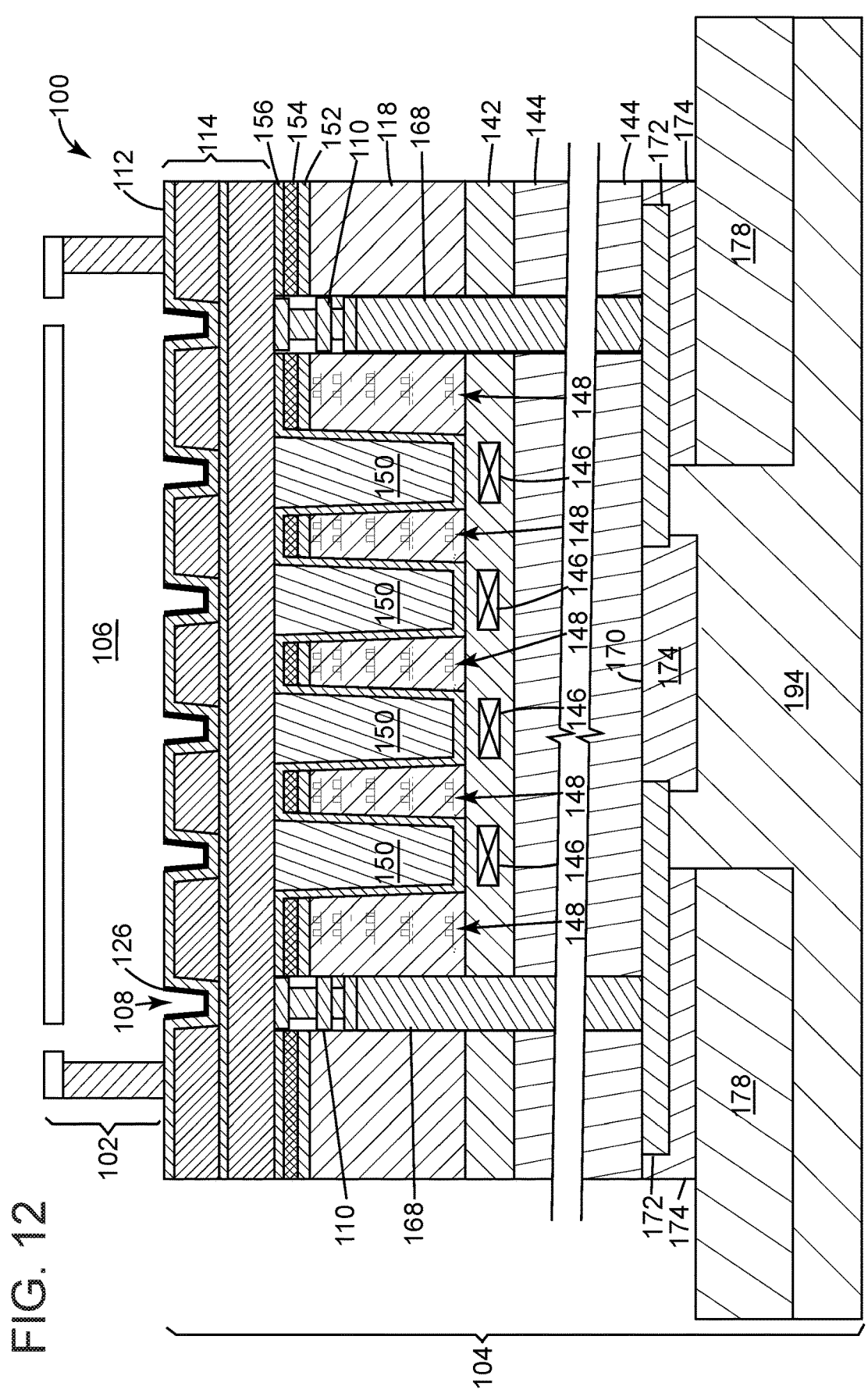
FIG. 12 is a simplified cross sectional view of the sensor system of FIG. 11, wherein the flow cell is bonded to the image sensor structure in accordance with one example disclosed herein.
Figure 13:
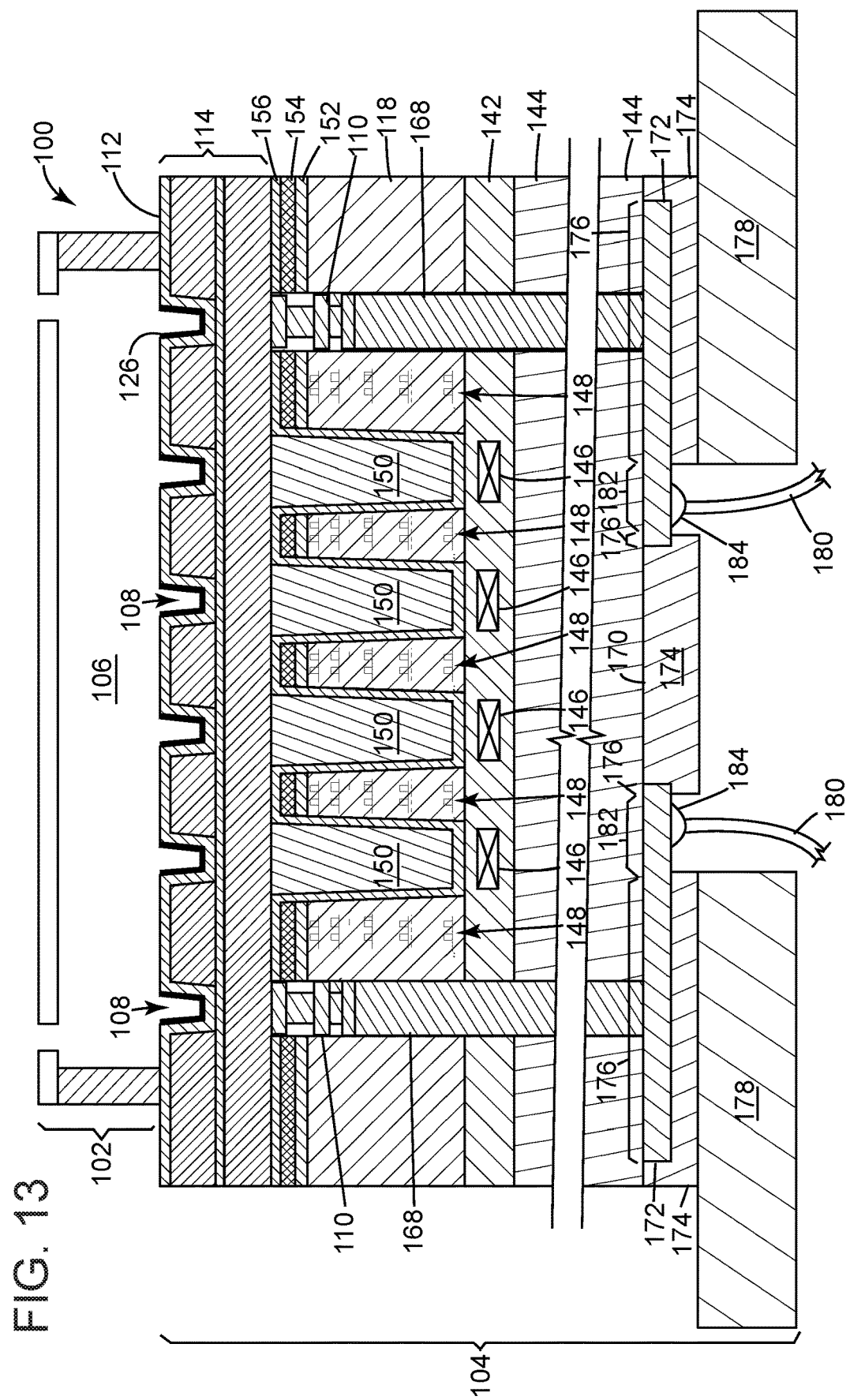
Figure 14:
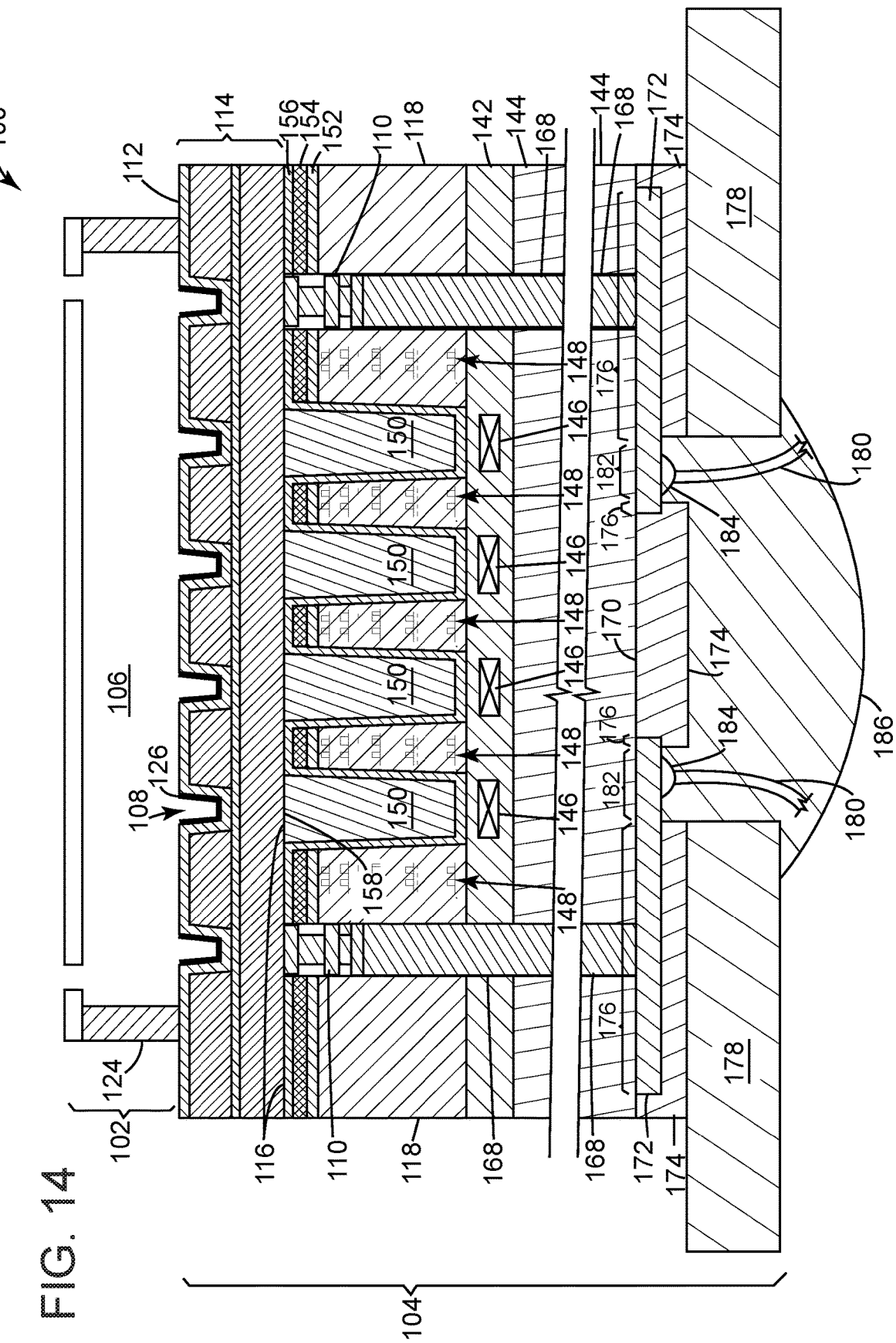

FIG. 13 is a simplified cross sectional view of the sensor system of FIG. 12, wherein wires are bonded to a $2^{nd}$ portion of the RDL in accordance with one example disclosed herein; and FIG. 14 is a simplified cross sectional view of the sensor system of FIG. 13, wherein a $2^{nd}$ environmental protection layer is disposed over the $2^{nd}$ portion of the RDL and the bonded wires to complete the formation of the sensor system in accordance with one example disclosed herein.

DETAILED DESCRIPTION

Certain examples of will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example may be combined with the features of other examples. Such modifications and variations are intended to be included within the scope of the present disclosure.

The terms "substantially", "approximately", "about", "relatively" or other such similar terms that may be used throughout this disclosure, including the claims, are used to describe and account for small fluctuations, such as due to variations in processing. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Examples provided herein relate to sensor systems and methods of making the same. More specifically, examples provided herein relate to sensor systems having a flow channel disposed over nanowells and bond pads.

Figure 1:
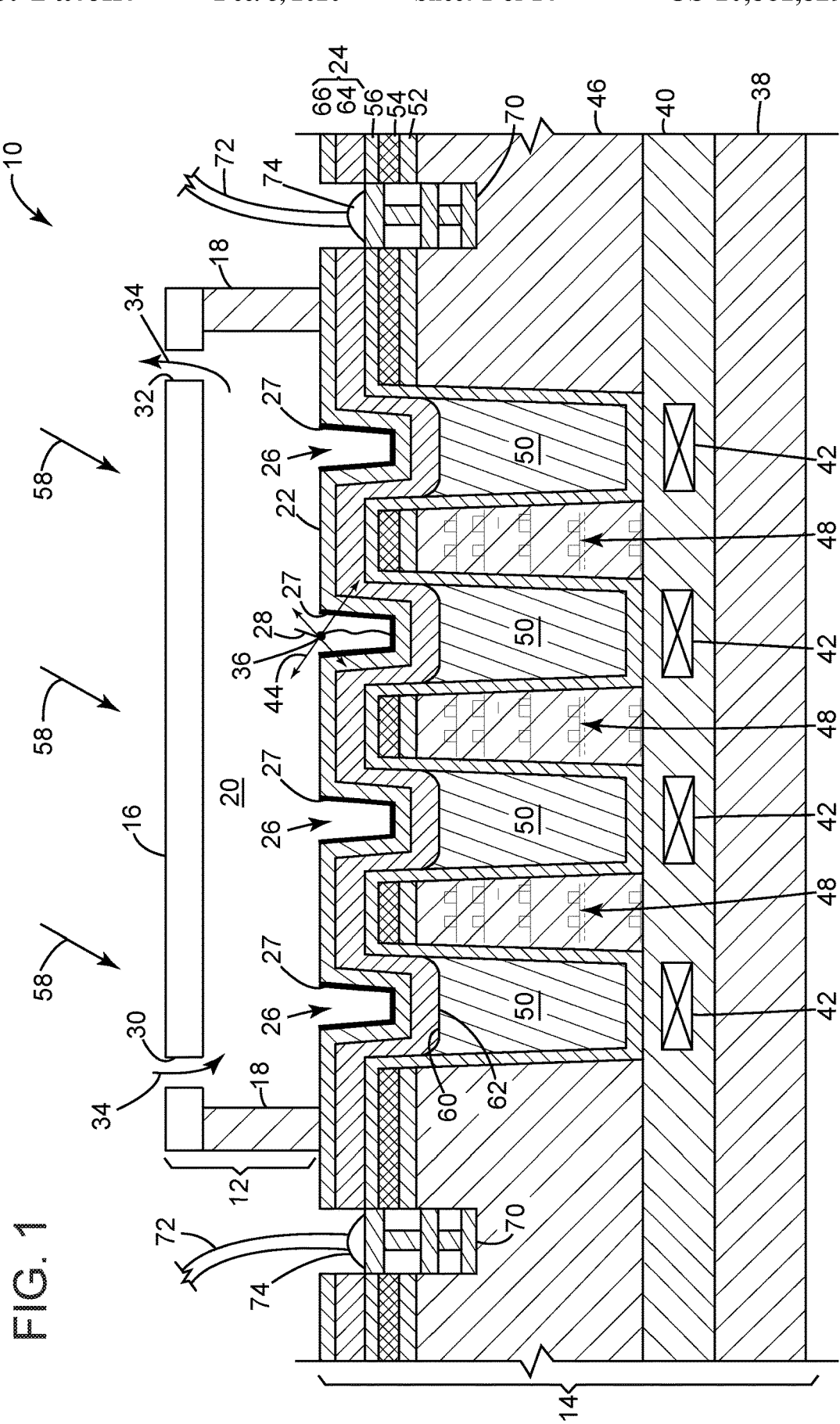
FIG. 1 is a simplified cross sectional side view of an example of one type of a sensor system having a flow cell disposed on an image sensor structure to form a flow channel therebetween, the image sensor structure having an array of nanowells disposed within the flow channel, the image sensor structure also having bond pads disposed external to the flow channel.
Figure 2:
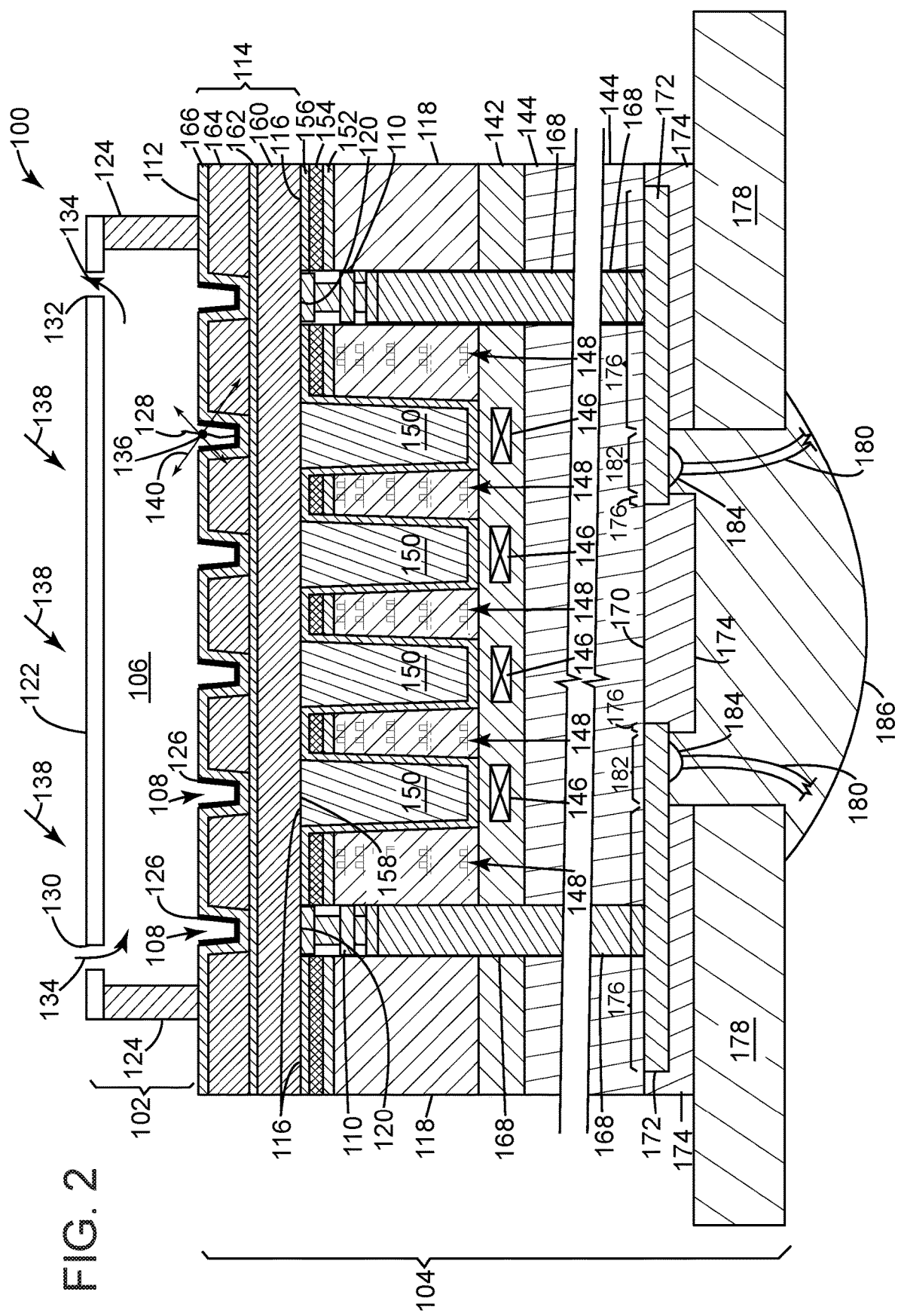
FIG. 2 is a simplified cross sectional side view of a sensor system having a flow cell disposed on an image sensor structure to form a flow channel therebetween, the image sensor structure including an array of nanowells disposed within the flow channel, the image sensor structure also including bond pads disposed within the flow channel in accordance with one example disclosed herein.

FIG. 1 illustrates a prior art sensor system having nanowells disposed within a flow channel and bond pads disposed external to the flow channel. FIG. 2 illustrates an example of a sensor system having a flow channel disposed over nanowells and bond pads in accordance with the present disclosure. FIGS. 3-14 illustrate various examples of methods of making the sensor system of FIG. 2 in accordance with the present disclosure.

Referring to FIG. 1, an example of one type of a sensor system 10 (which, in this example, is a biosensor system 10) includes a flow cell 12 bonded to an image sensor structure 14. The flow cell 12 of the sensor system 10 includes a flow cell cover 16 affixed to flow cell sidewalls 18. The flow cell sidewalls 18 are bonded to a top layer 22 of a passivation stack 24 of the image sensor structure 14 to form a flow channel 20 therebetween.

The top layer 22 of the passivation stack 24 includes a large array of nanowells 26 disposed therein. The nanowells 26 include a thin layer of hydrogel 27 which conforms to the inner surfaces of the nanowells 26. The hydrogel layer 27 is used to aid in anchoring and functionalizing analytes 28 (such as DNA segments, oligonucleotides, other nucleic-acid chains or the like), which may be disposed within the nanowells 26.

The flow cell cover includes an inlet port 30 and an outlet port 32 that are sized to allow fluid flow 34 into, through and out of the flow channels 20. The fluid flow 34 may be utilized to perform a large number of various controlled reaction protocols on the analytes 28 disposed within the nanowells 26. The fluid flow 34 may also deliver an identifiable label 36 (such as a fluorescently labeled nucleotide molecule or the like) that can be used to tag the analytes 28.

The image sensor structure 14 of the sensor system 10 includes an image layer 40 disposed over a base substrate 38. The image layer 38 may be a dielectric layer, such as silicon nitride ($Si_xN_x$) and may contain an array of light detectors 42 disposed therein. A light detector 42 as used herein may be, for example, a semiconductor, such as a photodiode, a complementary metal oxide semiconductor (CMOS) material, or both. The light detectors 42 detect light photons of emissive light 44 that is emitted from the fluorescent labels 36 attached to the analytes 28 in the nanowells 26. The base substrate 38 may be glass, silicon or other like material.

A device stack 46 is disposed over the image layer 40. The device stack 44 may contain a plurality of dielectric layers (not shown) that contain various device circuitry 48 which interfaces with the light detectors 42 and processes data signals using the detected light photons of the emissive light 44.

Also disposed in the device stack 46 is an array of light guides 50. Each light guide 50 is associated with at least one light detector 42 of the array of light detectors. For example, the light guide 50 may be located directly over its associated light detector 42. The light guides 50 direct photons of emissive light 44 from the fluorescent labels 36 on the analytes 28 disposed in the nanowells 26 to their associated light detectors 42.

Also disposed within the device stack 46, is a light shield layer 52, an anti-reflective layer 54 and a protective liner layer 56. The protective liner layer 56, may be composed of a silicon nitride (SiN) or silicon dioxide (SiO2), and lines the inside walls of the light guides 50. The light shield layer 52, may be composed of tungsten (W) or Aluminum (Al) and attenuates emissive light 44 and excitation light 58 transmitted into the device stack 46. The anti-reflective layer 54, may be composed of a tungsten nitride (WN) or silicon oxynitride (SiON) for photolithographic patterning of a metal layer underneath.

The passivation stack 24 is disposed over the device stack 46. The passivation stack 24 includes a bottom surface 60 that is in direct contact with a top surface 62 of the light guides 50. The passivation stack 24, may include a passivation layer 64 and a chemical protection layer 66 (which in this case is the top layer 22 of the passivation stack 24). The passivation layer 64, may be composed of SiN and include the bottom surface 60 of the passivation stack 24. The chemical protection layer 66, may be composed of a tantalum pentoxide ($Ta_2O_5$) and be the top layer 22 of the passivation stack 24.

The array of nanowells 26 is also disposed in the top layer 22 of the passivation stack 24, wherein each nanowell 26 is associated with a light guide 50 of the array of light guides. For example, each nanowell 26 may be located directly above an associated light guide 50, such that most of the photons of emissive light 44 that enter the top surface 62 of each light guide 50 are generated from within that light guide's associated nanowell 26. Additionally the array of nanowells 26 is disposed within the flow channel 20.

A plurality of bond pads 70 is also disposed in the device stack 46. The bond pads 70 may be composed of one or more layers of pad metals (not shown). The bond pads interface with the device circuitry 48 to conduct the data signals, which were processed using the detected light photons, to wires 72 bonded to the bond pads 70.

During operation, various types of excitation light 58 is radiated onto the analytes 28 in the nanowells 26, causing the labeled molecules 36 to fluoresce emissive light 44. The majority of photons of emissive light 44 may be transmitted through the passivation stack 24 and enter the top surface 62 of its associate light guide 50. The light guides 50 may filter out most of the excitation light 58 and direct the emissive light 44 to an associated light detector 42 located directly below the light guide 50.

The light detectors 42 detect the emissive light photons. The device circuitry 48 within the device stack 46 then processes and transmits data signals using those detected photons. The data signals may then be transmitted through the bond pads 70 and analyzed to reveal properties of the analytes.

The bond pads 70 may be bonded to wires 72 through wire bonds 74 disposed on the top layer 22 of the passivation stack 24 to enable transmission of the data signals externally. This may be done by forming a eutectic metal bond through wire bonding or solder bump bonding. Additionally, the surface of the nanowells 26 may be chemically functionalized, as for example with the deposition of the hydrogel layer 27, in order to be able to receive the analytes 28 that may be disposed in the nanowells 26.

However, the processes for preparing the bond pads 70 on the top layer 22 of the passivation stack 24 for such wire bonding techniques may contaminate the surface functionalization of the nanowells. Further the chemical functionalization of the nanowells may deposit residue on, and/or potentially corrode, the open bond pads. Also, the fluid flow 34 through the flow channel 20 that is used during a variety of controlled reaction protocols may potentially damage, and/or corrode, any bond pads 70 that are exposed to such fluid flow 34. Moreover, it may be difficult to electrically connect the wires 72 to the bond pads 70 at the top layer 22 of the passivation stack 24, if the wires 70 had to extend into the flow channel 20.

For at least the above reasons, the bond pads 70 are disposed on the top layer 22 of the passivation stack 24 external to the flow channel 20 of the flow cell 12. Accordingly, bonding wires or solder bumps to the bond pads 70 limit the size of the flow channel 20, which also limits the amount of nanowells 26 that can be disposed within the flow channel 20 for a sensor system 10 that has a fixed footprint.

The example sensor systems described herein differ from some pre-existing sensor systems in several aspects. For example, that the bond pads 70 of some examples herein are disposed within the flow channel 20. Additionally, the examples herein provide extending the flow channel 20 over the bond pads 70 to cover a larger surface area in the same biosensor footprint. Additionally, the examples herein provide mechanisms to protect the bond pads 70 from being damaged, and/or corroded, by exposure to fluid flow 34 through the flow channel 20.

Referring to FIG. 2, a cross sectional side view of an example of a sensor system 100 having a flow cell 102 disposed on an image sensor structure 104 to form a flow channel 106, which extends over an array of nanowells 108 and a plurality of bond pads 110, is illustrated. The array of nanowells 108 is disposed in a top layer 112 of a passivation stack 114 of the image sensor structure 104. The plurality of bond pads 110 is disposed under a bottom surface 116 of the passivation stack 114. More specifically, the bond pads 110 are disposed in a device stack 118, wherein a top surface 120 of the bond pads 110 is disposed below the bottom surface 116 of the passivation stack.

The flow cell 102 of the sensor system 100 includes a flow cell cover 122 affixed to flow cell sidewalls 124. The flow cell sidewalls 124 are bonded to the top layer 112 of the passivation stack 114 of the image sensor structure 104 to form the flow channel 106 therebetween.

The top layer 112 of the passivation stack 114 includes the large array of nanowells 108 disposed therein. The nanowells 108 include a thin layer of hydrogel 126 within the nanowells 108. The hydrogel layer 126 is used to anchor and functionalize analytes 128 (such as DNA segments, oligonucleotides, other nucleic-acid chains or the like), which may be disposed within the nanowells 108.

The flow cell cover 122 includes an inlet port 130 and an outlet port 132 that are sized to allow fluid flow 134 into, through and out of the flow channels 106. The fluid flow 134 may be utilized to perform a large number of various controlled reaction protocols on the analytes 128 disposed within the nanowells 106. The fluid flow 134 may also deliver an identifiable label 136 (such as a fluorescently labeled nucleotide molecule or the like) that can be used to tag the analytes 128. During various controlled reaction protocols, an excitation light 138 may be directed upon the fluorescent labels 136, which causes the labels 136 to fluoresce an emissive light 140.

The image sensor structure 104 of the sensor system 100 includes an image layer 142 disposed over a base substrate 144. The image layer 142 may be a dielectric layer, such as SiN and may contain an array of light detectors 146 disposed therein. A light detector 146 as used herein may be, for example, a semiconductor, such as a photodiode, a complementary metal oxide semiconductor (CMOS) material, or both. The light detectors 146 detect light photons of the emissive light 140 that are emitted from the fluorescent labels 136 attached to the analytes 128 in the nanowells 108. The base substrate 144 may be glass, silicon or other like material.

The device stack 118 is disposed over the image layer 142. The device stack 118 may contain a plurality of dielectric layers (not shown) that contain various device circuitry 148 which interfaces with the light detectors 146 and processes data signals using the detected light photons of the emissive light 140.

Also disposed in the device stack 118 is an array of light guides 150. Each light guide 150 is associated with at least one light detector 146 of the array of light detectors. For example, the light guide 150 may be located directly over its associated light detector 146. The light guides 150 direct photons of emissive light 140 from the fluorescent labels 136 on the analytes 128 disposed in the nanowells 108 to their associated light detectors 146.

The light guide 150 may be an organic filter material that is capable of filtering out the known wavelengths of excitation light 138 and transmitting through known wavelengths of emissive light 140. The light guide material may be composed of custom formulated dye molecules arranged in a high index polymer matrix.

Also disposed within the device stack 118, is a light shield layer 152, an anti-reflective layer 154 and a protective liner layer 156. The protective liner layer 156, may be composed of a dielectric material, such as silicon nitride (SiN) or other similar materials, and lines the inside walls of the light guides 150. The light shield layer 152, may be composed of a transition metal, such as tungsten (W) or other similar materials, and attenuates emissive light 140 and excitation light 138 transmitted into the device stack 118. The anti-reflective layer 154, may be composed of an anti-reflective compound, such as tungsten nitride (WN) or silicon oxynitride (SiON), or other similar materials, and be used for photolithographic patterning of a metal layer underneath.

The passivation stack 114 is disposed over the device stack 118. The passivation stack 114 includes the bottom surface 116 that is in direct contact with a top surface 158 of the light guides 150 and that is over the top surface 120 of the bond pads 110. The passivation stack also includes the top layer 112 into which the nanowells 108 are disposed.

The passivation stack 114, may include any number of layers. For example, the passivation stack 114 may include a $1^{st}$ passivation layer 160 that is disposed over the device stack 118 and a $1^{st}$ chemical protection layer 162 that is disposed over the $1^{st}$ passivation layer 160. In this example, the top layer 112 of the passivation stack 114 is the $1^{st}$ chemical protection layer 162, which includes the nanowells 108 disposed therein.

However, in the specific example illustrated in FIG. 2, the passivation stack 114 includes an additional $2^{nd}$ passivation layer 164 disposed over the $1^{st}$ chemical layer 162 plus an additional $2^{nd}$ chemical protection layer 166 disposed over the $2^{nd}$ passivation layer 164. In this specific FIG. 2 example, the top layer 112 of the passivation stack 114 is the $2^{nd}$ chemical protection layer 166, wherein the nanowells 108 are disposed in the $2^{nd}$ chemical protection layer 166.

The passivation layers 160, 164, may be composed of SiN. The chemical protection layers 162, 166, may be composed of a transition metal oxide, such as tantalum pentoxide ($Ta_2O_5$) or other similar materials.

Each nanowell 108, of the array of nanowells, is associated with a light guide 150 of the array of light guides. For example, each nanowell 108 may be located directly above an associated light guide 150, such that most of the photons of emissive light 140 that enters the top surface 158 of each light guide 150 is generated from within that light guide's associated nanowell 108. Additionally the array of nanowells 108 is disposed within the flow channel 106.

The plurality of bond pads 110 is also disposed in the device stack 118. Though only two bond pads 110 are illustrated in FIG. 2, there can be any number of bond pads 110, from one bond pad to hundreds of bond pads and more. The bond pads 110 may be composed of one or more layers (not shown) of pad metals, such as any suitable metals, including tungsten, copper, or other similar materials.

Through-silicon via (TSV) 168 are disposed in electrical contact with the bond pads 110. The TSV 168 extend from the bond pads 110 through the base substrate 144 to a bottom surface 170 of the base substrate 144. The TSV may be composed of transition metal, such as tungsten or other similar materials.

A redistribution layer (RDL) 172 is disposed on the bottom surface 170 of the base substrate 144. The RDL 172 is in electrical contact with the TSV 168. The RDL may be composed of a metal, such as tungsten, copper, gold, nickel, or other similar materials.

A $1^{st}$ environmental protection layer 174 is disposed over a $1^{st}$ portion 176 of the RDL 172. The $1^{st}$ environmental protection layer may be composed of polyimide.

Mechanical support structures 178 are disposed over the $1^{st}$ environmental protection layer 174. The mechanical support layers 178 may be composed of a wafer, such as silicon wafer, glass wafer, or other similar materials.

Wires 180 are bonded in electrical contact to a $2^{nd}$ portion 182 of the RDL 172 to form wire bonds 184. This may be done by forming a eutectic metal bond through wire bonding, solder bump bonding or by utilizing other well-known wire connection techniques. The wires 180 may comprise an electrically conductive material, such as copper, or other similar materials.

A $2^{nd}$ environmental protection layer 186 is disposed over the $2^{nd}$ portion 182 of the RDL 172, wherein the $1^{st}$ and $2^{nd}$ environmental protection layers 174, 186 cover the entire RDL 172. The $2^{nd}$ environmental protection layer 186 may be composed of a polymer, such as epoxy, UV curable polymer, or other similar materials.

During operation of a controlled reaction protocol, nanowells 108 receive analytes 128 that are tagged with a fluorescent molecular label 136. The fluorescent labels 136 are delivered to the analytes via the fluid flow 134 through the flow channel 106. The fluorescent labels 136 generate emissive light 140 in response to an excitation light 138. Photons of the emissive light 140 are transmitted from a nanowell 108, through the passivation stack 114, and into the top surface 158 of an associated light guide 150, which may be located directly below the nanowell 108. The photons of emissive light 140 are then guided by the associated light guide 150 to an associated light detector 146, which may be located directly below the light guide 150. The associated light detectors 146 detect the photons of emissive light 140. Additionally, device circuitry 148 is integrated with the light detectors 146 to process the detected emissive light photons and provide data signals using the detected emissive light photons. The device circuitry 148 is also integrated with the bond pads 110 such that the data signals are transmitted through the bond pads 110, through the TSV 168 and out the wires 180 located on the bottom surface 170 of the base substrate 114, wherein those data signals can then be analyzed.

During many such controlled reaction protocols, the fluid flow 134 may be damaging, and/or corrosive, to any exposed areas of the bond pads 110. However, the bond pads 110 in this example of FIG. 2 are protected by the passivation stack 114, which is disposed over the bond pads 110. Therefore, the flow channel 106 may be disposed over the bond pads 110, since the passivation stack 114 is disposed between the flow channel 106 and the bond pads 110. Additionally, the flow cell 102 area can be expanded over the bond pads 110 to increase the number of nanowells 108 disposed within the flow channel 106 and to increase throughput of the sensor system 100 without increasing the footprint of the sensor system 100.

Figure 3:
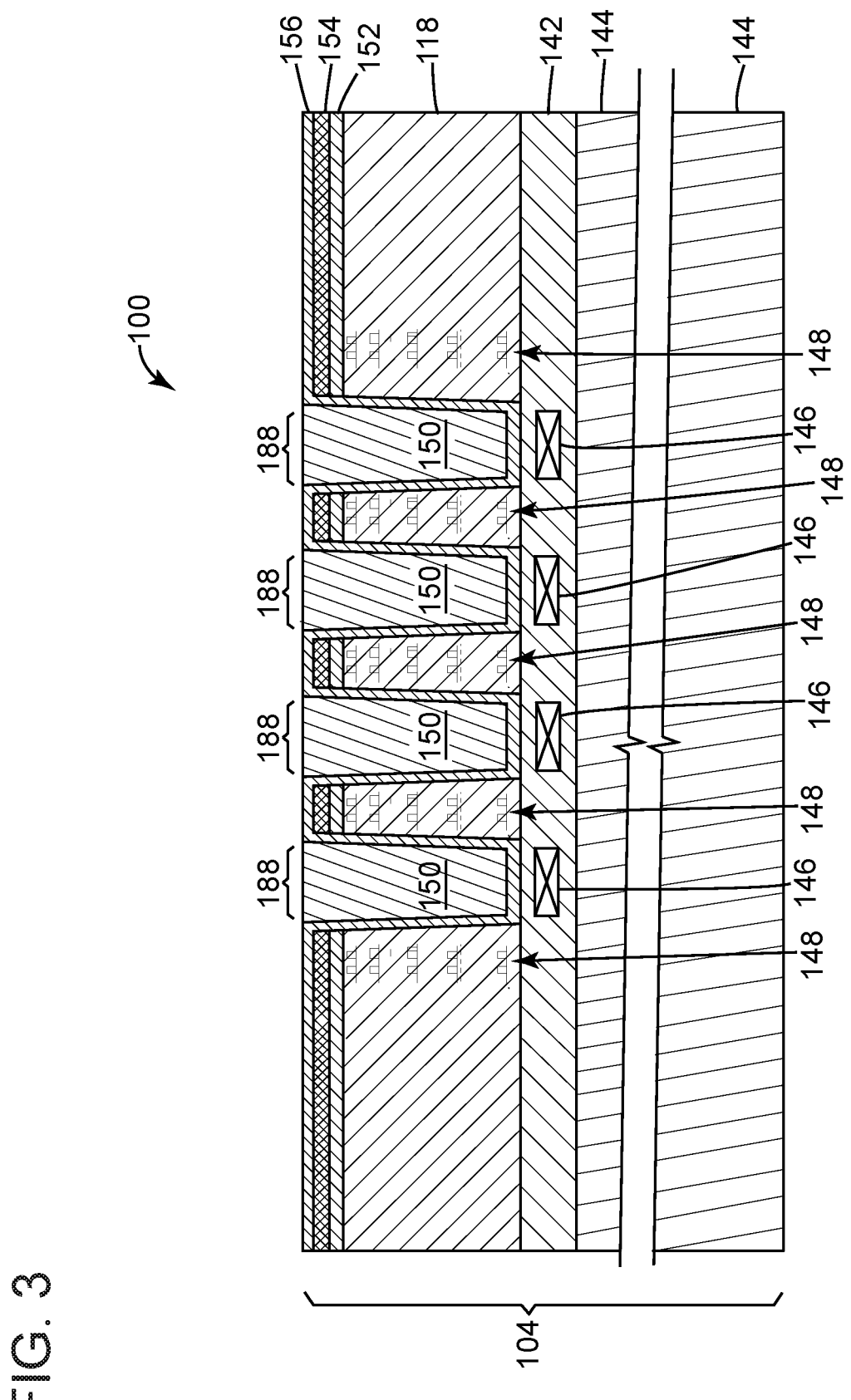
FIG. 3 is a simplified cross sectional view of the sensor system of FIG. 2 at an intermediate stage of manufacture, wherein the image sensor structure includes light guides disposed in a device stack and the device stack disposed on a base substrate in accordance with one example disclosed herein.

Referring to FIG. 3, a cross sectional side view of an example of sensor system 100 at an intermediate stage of manufacture is illustrated. At this stage of the process flow, the device stack 118 and image layer 142 are disposed respectively over the base substrate layer 144.

The image layer includes the array of light detectors 146 disposed therein. The image layer 142 can be disposed over the base substrate 144 using any one of several deposition techniques, such as chemical vapor deposition (CVD) or physical vapor deposition (PVD).

The multiple dielectric layers (not shown) of the device stack 118, with its associated device circuitry 148, can also be disposed over the image layer 142 using deposition techniques. The light shield layer 152 and the anti-reflective layer 154 may thereafter be disposed over the device stack 118 using any suitable deposition techniques, such as CVD, PVD, atomic layer deposition (ALD) or electro-plating.

Thereafter in the process flow, an array of light guide apertures 188 are etched into the device stack 118. This can be done using any suitable etching processes, such as an anisotropic etching process, such as reactive ion etching (RIE). An etching process in this disclosure may include patterning, such as lithographical patterning.

The protective liner layer 156 can then be disposed over the partially formed image sensor structure 104, including the inner surfaces of the apertures 100. This can be done using any suitable deposition techniques, such as CVD, PVD or ALD.

Thereafter in the process flow, a light guide layer (not shown) is disposed over the entire structure 100 to fill the apertures 188. The light guide layer may be composed of an organic filter material that is capable of filtering out the known wavelengths of excitation light 138 and transmitting through known wavelengths of emissive light 140.

The light guide layer is thereafter planarized down to complete the formation of the array of light guides 150 in the light guide apertures 188. Each light guide 150 being associated with at least one light detector 146 of the array of light detectors. This may be done using any suitable polishing techniques, such as a chemical mechanical polishing process.

Figure 4:
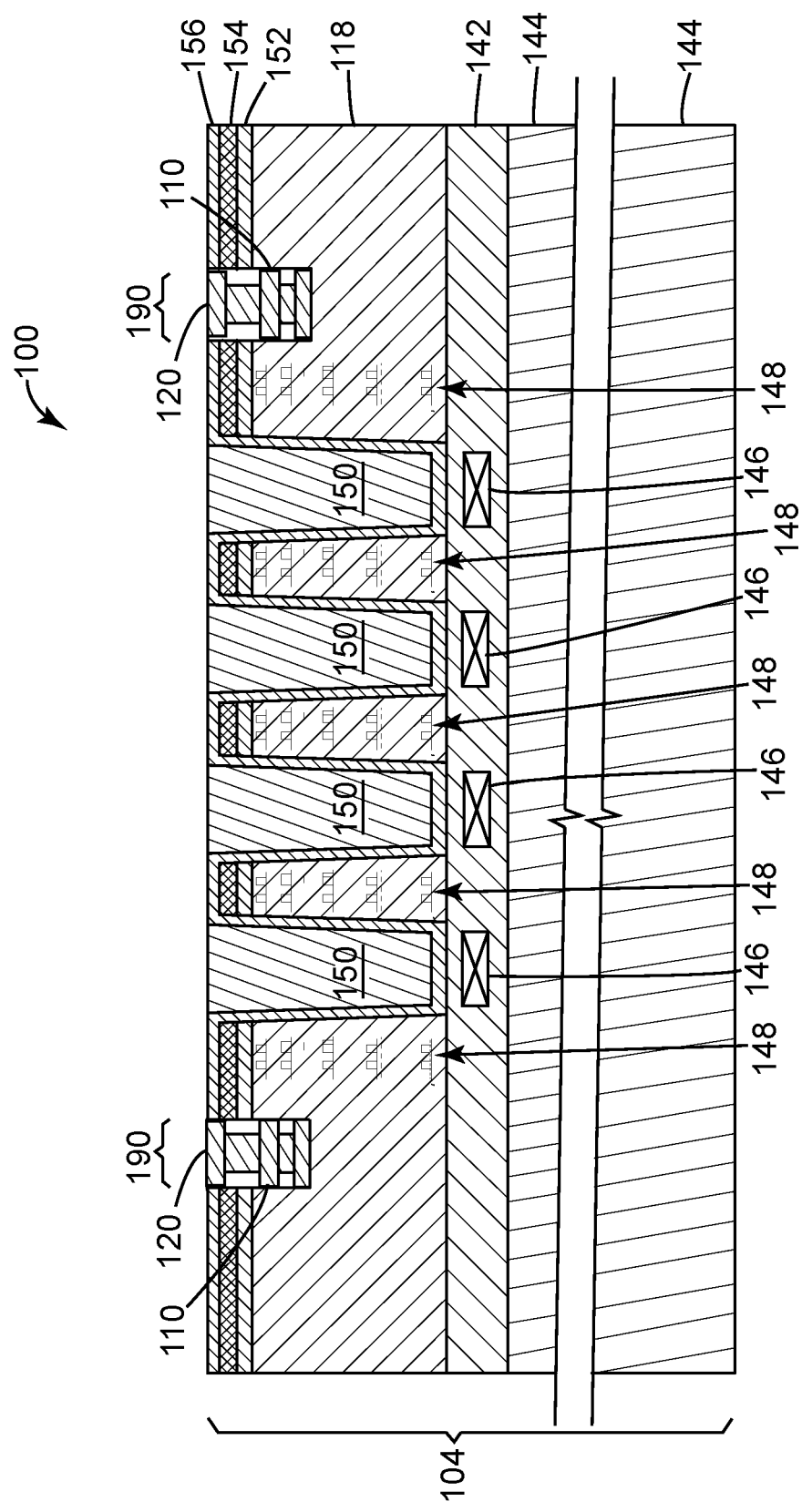
FIG. 4 is a simplified cross sectional view of the sensor system of FIG. 3, wherein the image sensor structure includes bond pads disposed in the device stack in accordance with one example disclosed herein.

Referring to FIG. 4, the bond pads 110 are disposed into the device stack 118. This may be done first by lithographically patterning and etching the device stack 118 to form bond pad apertures 190 in the device stack 118. Thereafter various layers of bond pad metals (not shown) may be disposed in the bond pad apertures 190 using any suitable disposing techniques, such as an ALD process, to form the bond pads 110.

Once the bond pad 110 is formed, its top surface 120 may be exposed for, and accessible to, electrical probing. The electrical probing enables a series of acceptance tests (such as continuity testing) on the sensor system 100.

Figure 5:
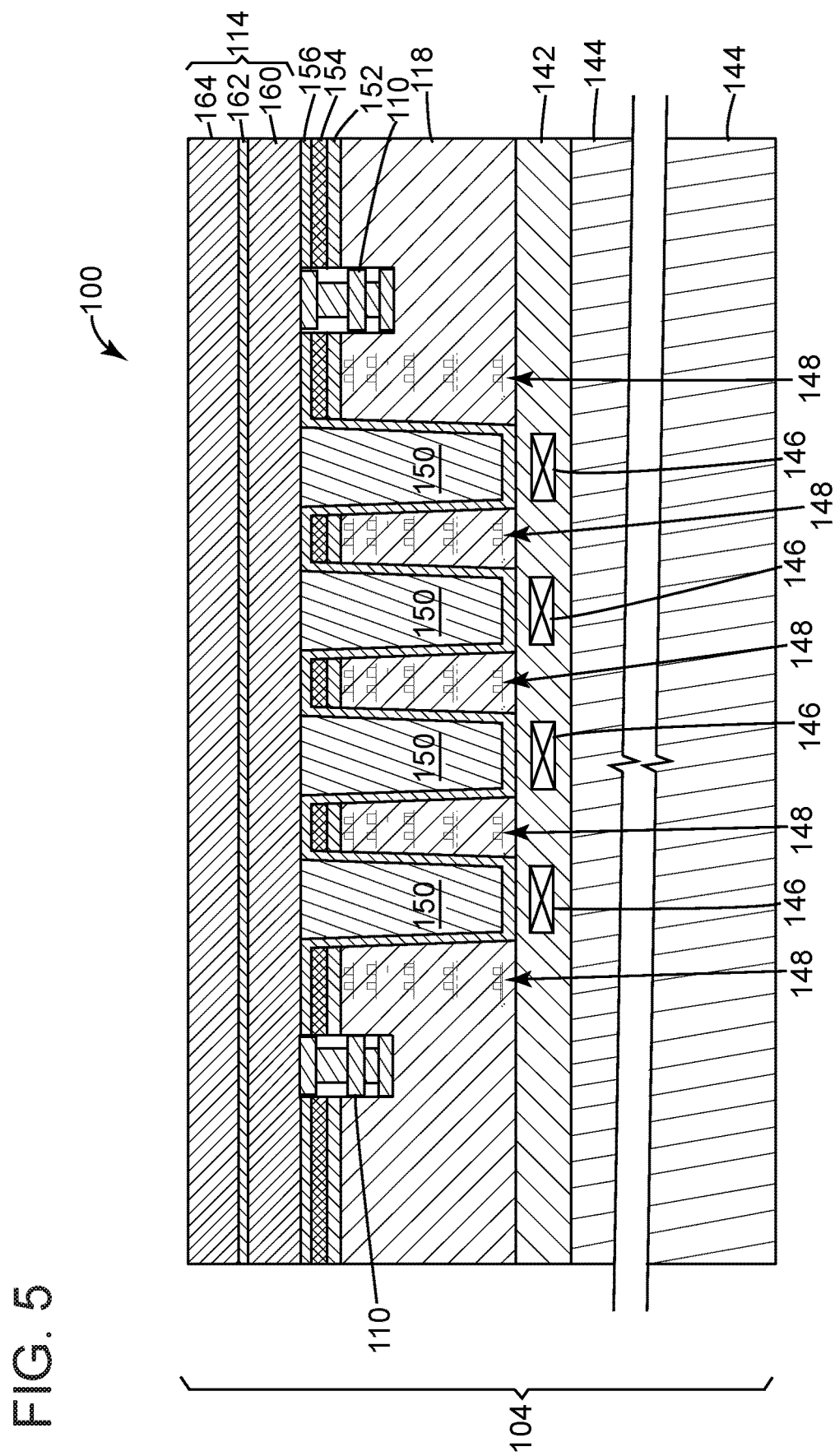
FIG. 5 is a simplified cross sectional view of the sensor system of FIG. 4, wherein the image sensor structure includes a passivation stack disposed over the device stack and the bond pads in accordance with one example disclosed herein.

Referring to FIG. 5, thereafter in the process flow, at least a portion of the passivation stack 114 is disposed over the device stack 118 and the bond pads 110. In the specific example illustrated in FIG. 5, $1^{st}$ passivation layer 160 is disposed over the array of light guides 150, such that the bottom surface 116 of the $1^{st}$ passivation layer 160 is in direct contact with the top surface 158 of the light guides 150. The $1^{st}$ chemical protection layer 162 can then be disposed over the $1^{st}$ passivation layer 160. The $2^{nd}$ passivation layer 166 can then be disposed over the $1^{st}$ chemical protection layer 162. Each of these processes can be done by any suitable deposition processes, such as CVD or PVD. The $1^{st}$ chemical protection layer 162 and $1^{st}$ and $2^{nd}$ passivation layers 160, 164 form at least a portion of the passivation stack 114. The portion of the passivation stack 114 may then coat the bond pads 110.

Figure 6:
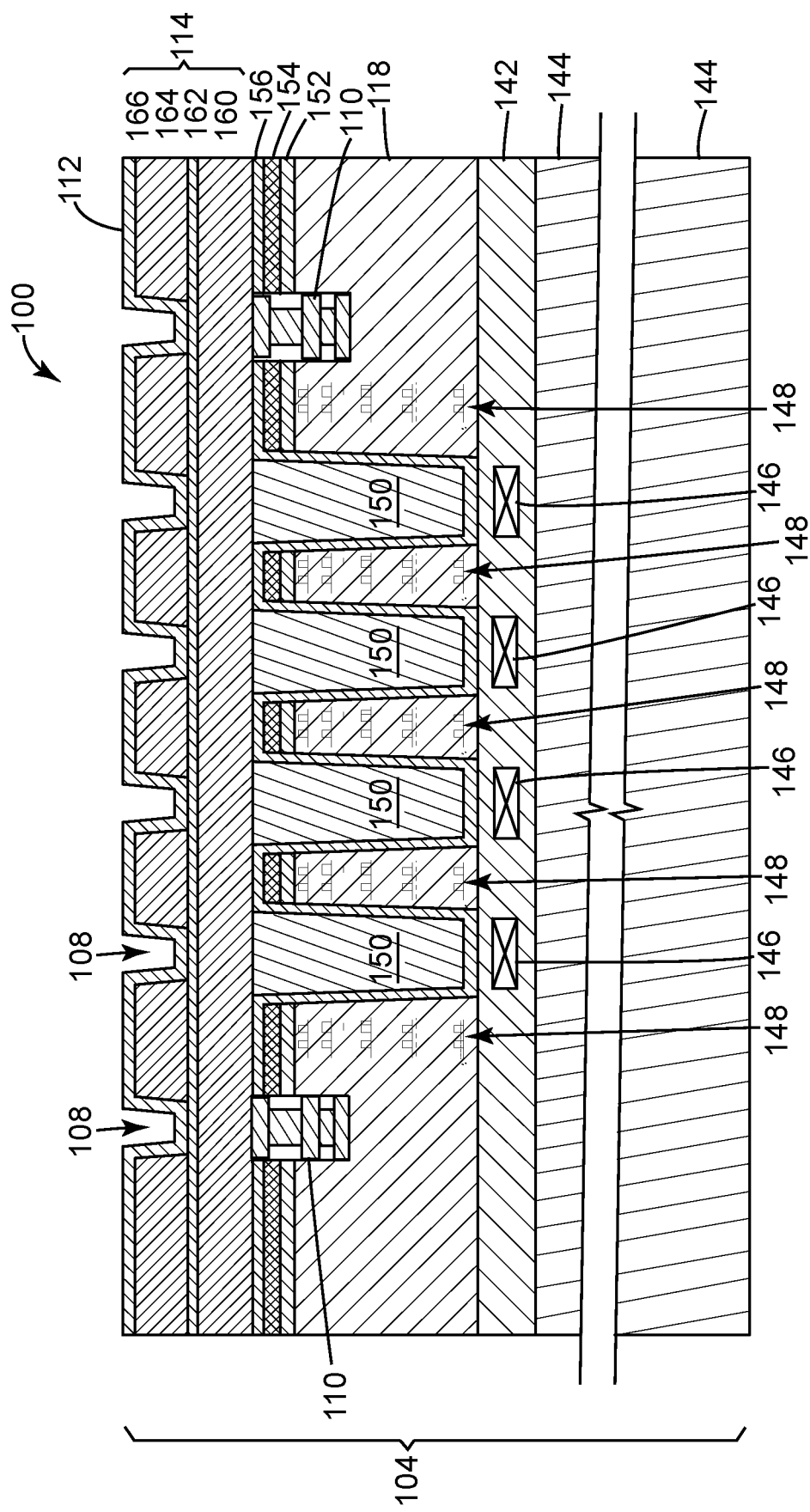
FIG. 6 is a simplified cross sectional view of the sensor system of FIG. 5, wherein the image sensor structure includes nanowells disposed into a top layer of the passivation stack in accordance with one example disclosed herein.

Referring to FIG. 6, thereafter in the process flow, the array of nanowells 108 is formed in a top layer 112 of the passivation stack 114. Each nanowell 108 being associated with a light guide 150 in the array of light guides.

In the specific example illustrated in FIG. 6, this is done by thereafter lithographically patterning and etching the array of nanowells 108 in the $2^{nd}$ chemical protection layer 164. Then disposing a $2^{nd}$ chemical protection layer 166 over the $2^{nd}$ passivation layer 164. The $2^{nd}$ chemical protection layer 166 may be disposed using any suitable deposition processes, sucg as CVD, PVD or ALD.

The $2^{nd}$ chemical protection layer 166 is the top layer 112 of the passivation stack 114. The $2^{nd}$ chemical protection layer 166 conforms to the nanowells 108 that have been etched into the $2^{nd}$ passivation layer 164 to form the nanowells 108 in the top layer 112 of the passivation stack 114.

Figure 7:
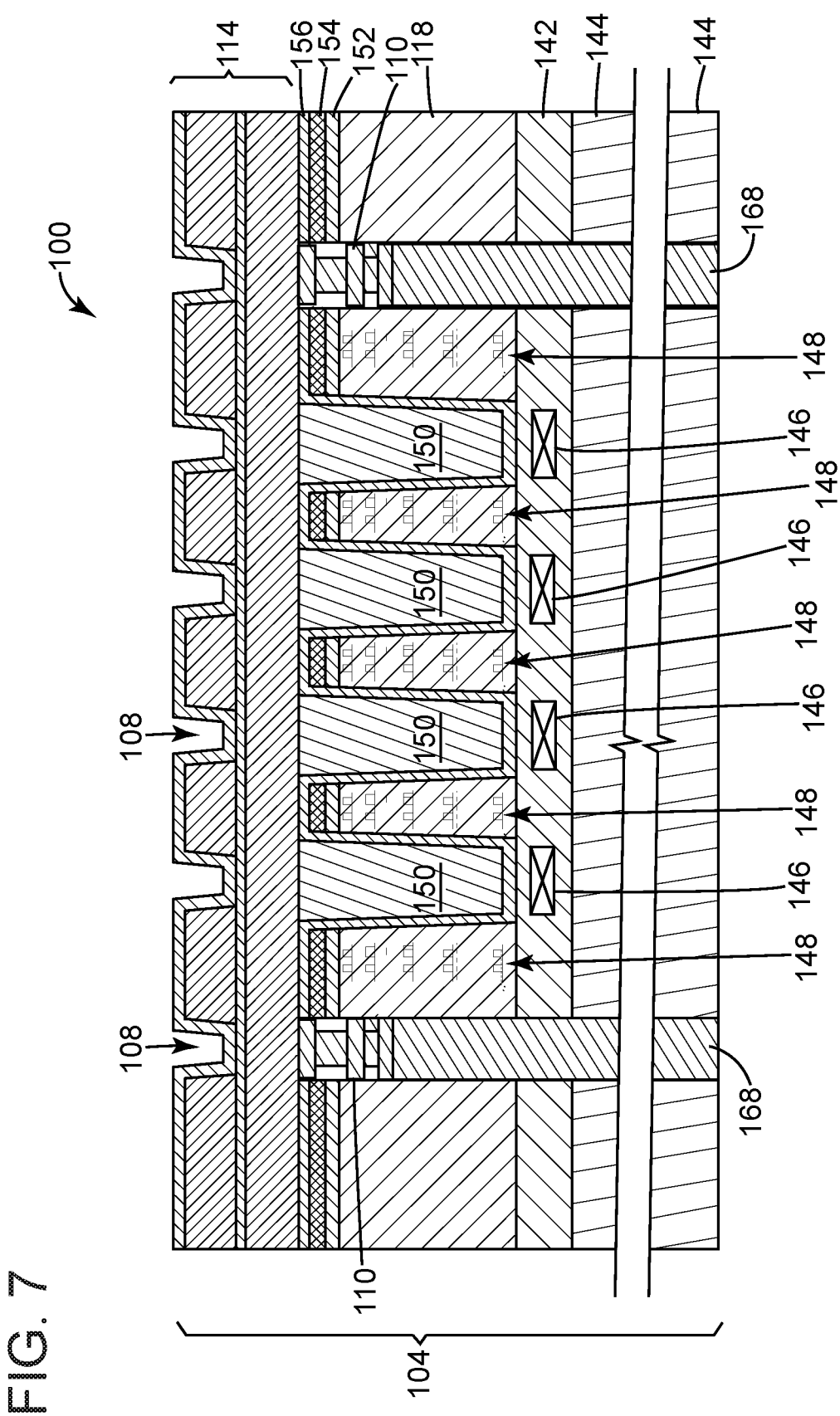
FIG. 7 is a simplified cross sectional view of the sensor system of FIG. 6, wherein the image sensor structure includes a through-silicon via (TSV) extending from a bottom surface of the base substrate to the bond pads in accordance with one example disclosed herein.

Referring to FIG. 7, thereafter in the process flow, the base substrate 144 is thinned to a predetermined thickness. This may be done by any suitable polishing processes, such as a chemical mechanical polishing (CMP) process or a grinding process.

Once thinned, TSV 168 are etched through the bottom surface 170 of the base substrate 144. The TSV 168 are etched to extend from the bottom surface 170 of the base substrate 144 to the bond pads 110. This can be done by any suitable etching processes, such as an RIE process.

The TSV 168 are then plated to make electrical contact with the bond pads 110. This may be done by any suitable plating processes, such as an electroplating process.

Figure 8:
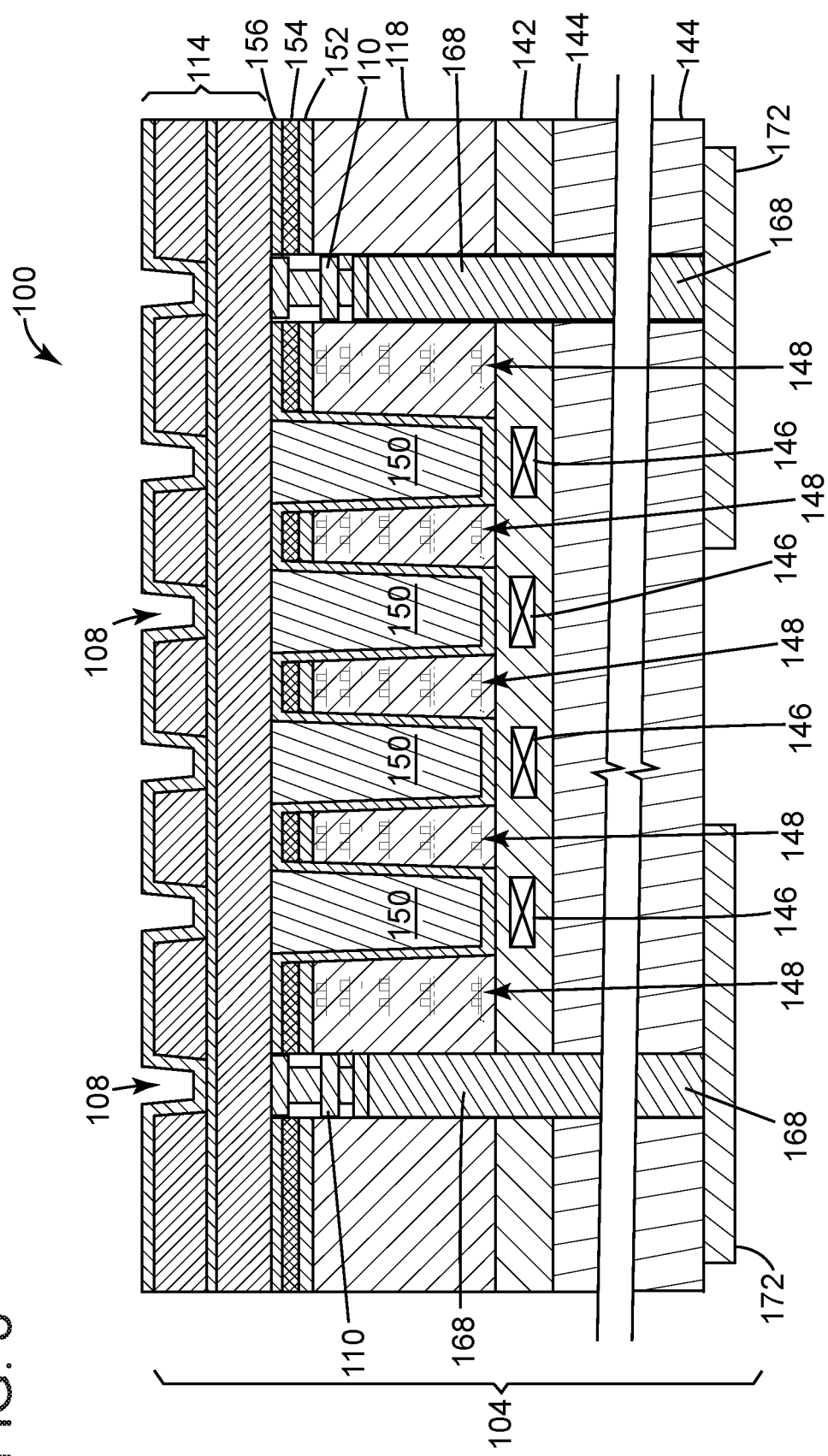
FIG. 8 is a simplified cross sectional view of the sensor system of FIG. 7, wherein the image sensor structure includes a redistribution layer (RDL) disposed on the bottom surface of the base substrate and in electrical contact with the TSV in accordance with one example disclosed herein.

Referring to FIG. 8, thereafter in the process flow, an RDL 172 is disposed on the bottom surface 170 of the base substrate 144. This can be done by first disposing the RDL 172 over the entire bottom surface 170, then lithographically patterning and etching the RDL to a predetermined shape.

Figure 9:
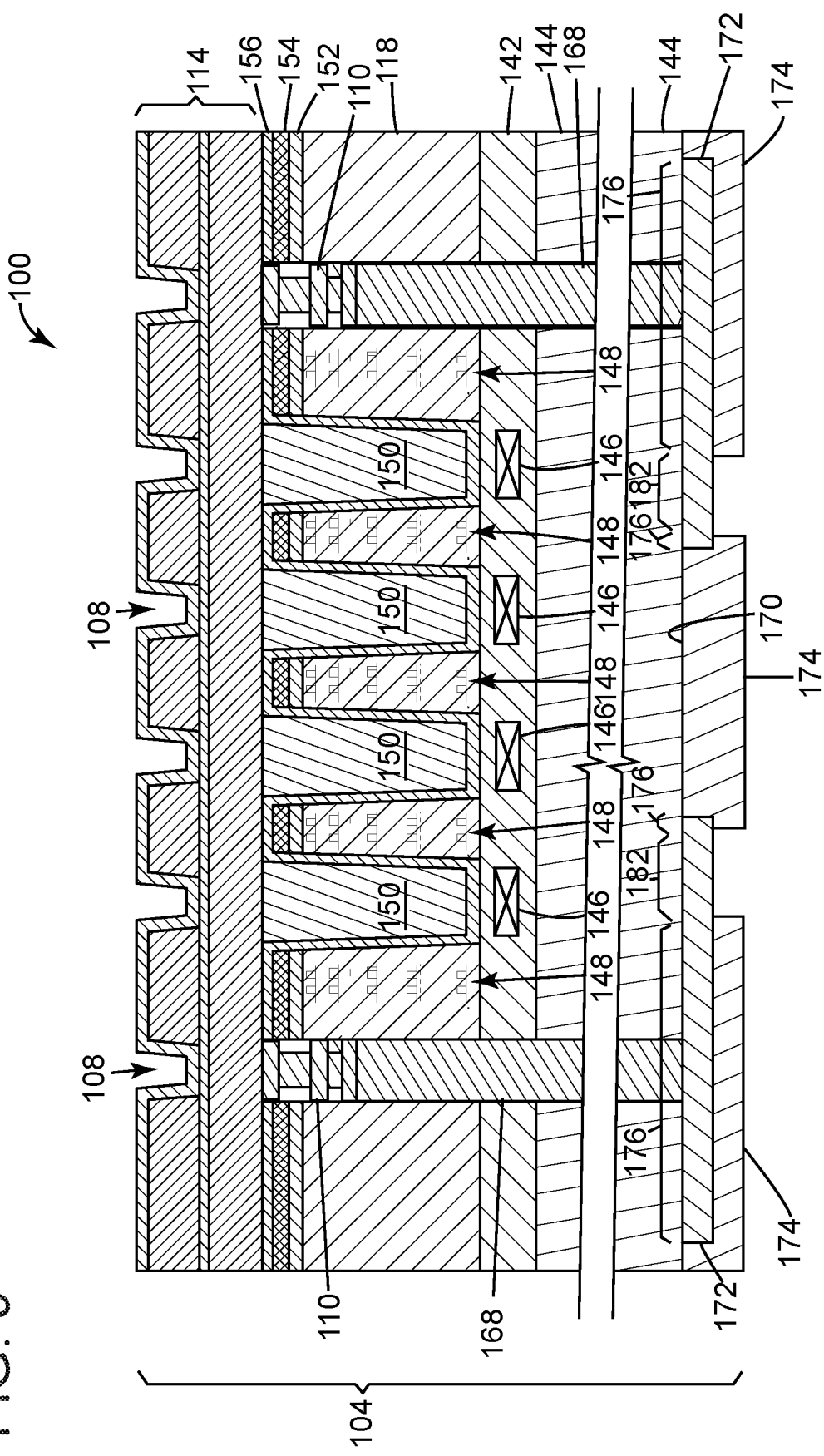
FIG. 9 is a simplified cross sectional view of the sensor system of FIG. 8, wherein the image sensor structure includes a first ($1^{st}$) environmental protection layer disposed over a $1^{st}$ portion of the RDL in accordance with one example disclosed herein.

Referring to FIG. 9, thereafter in the process flow, a $1^{st}$ environmental protection layer 174 is disposed over a $1^{st}$ portion 176 of the RDL 172. This may be done by any suitable deposition processes, such as CVD or PVD. A $2^{nd}$ portion 182 of the RDL 172 is left exposed as one or more bonding sites for wires 180 (best seen in FIG. 13).

Figure 10:
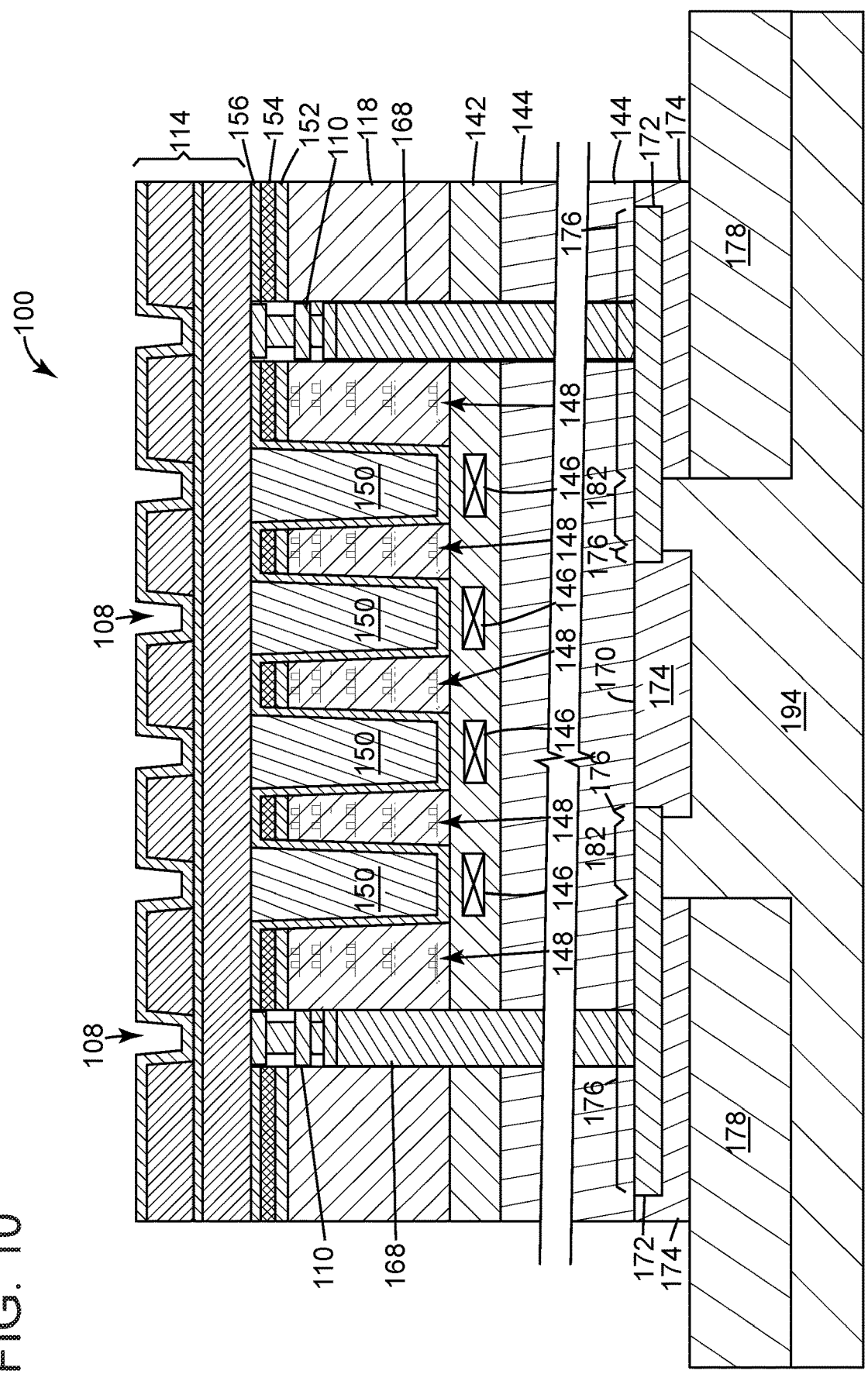
FIG. 10 is a simplified cross sectional view of the sensor system of FIG. 9, wherein the image sensor structure includes mechanical support structures bonded to the $1^{st}$ environmental protection layer and a temporary protection layer covering a second ($2^{nd}$) portion of the RDL in accordance with one example disclosed herein.

Referring to FIG. 10, thereafter in the process flow, mechanical support structures 178 are bonded over the $1^{st}$ environmental protection layers 174. This may be done by physical bonding, such as by adhesives or other mechanical bonding processes.

Thereafter a temporary protective layer 194 is disposed over the exposed $2^{nd}$ portions 182 of the RDL 172 to protect these $2^{nd}$ portions 182 during subsequent processing of the sensor system 100. The temporary protective layer 194 may be composed of a resist material. The temporary protective layer 194 may also be disposed by utilizing several temporary processes including, but not limited to, bonding a tape, a glass or a silicon wafer through a layer of pressure sensitive adhesive that is removable. The temporary protection layer 194 may also come in the form of solvent soluble wax coatings.

Figure 11:
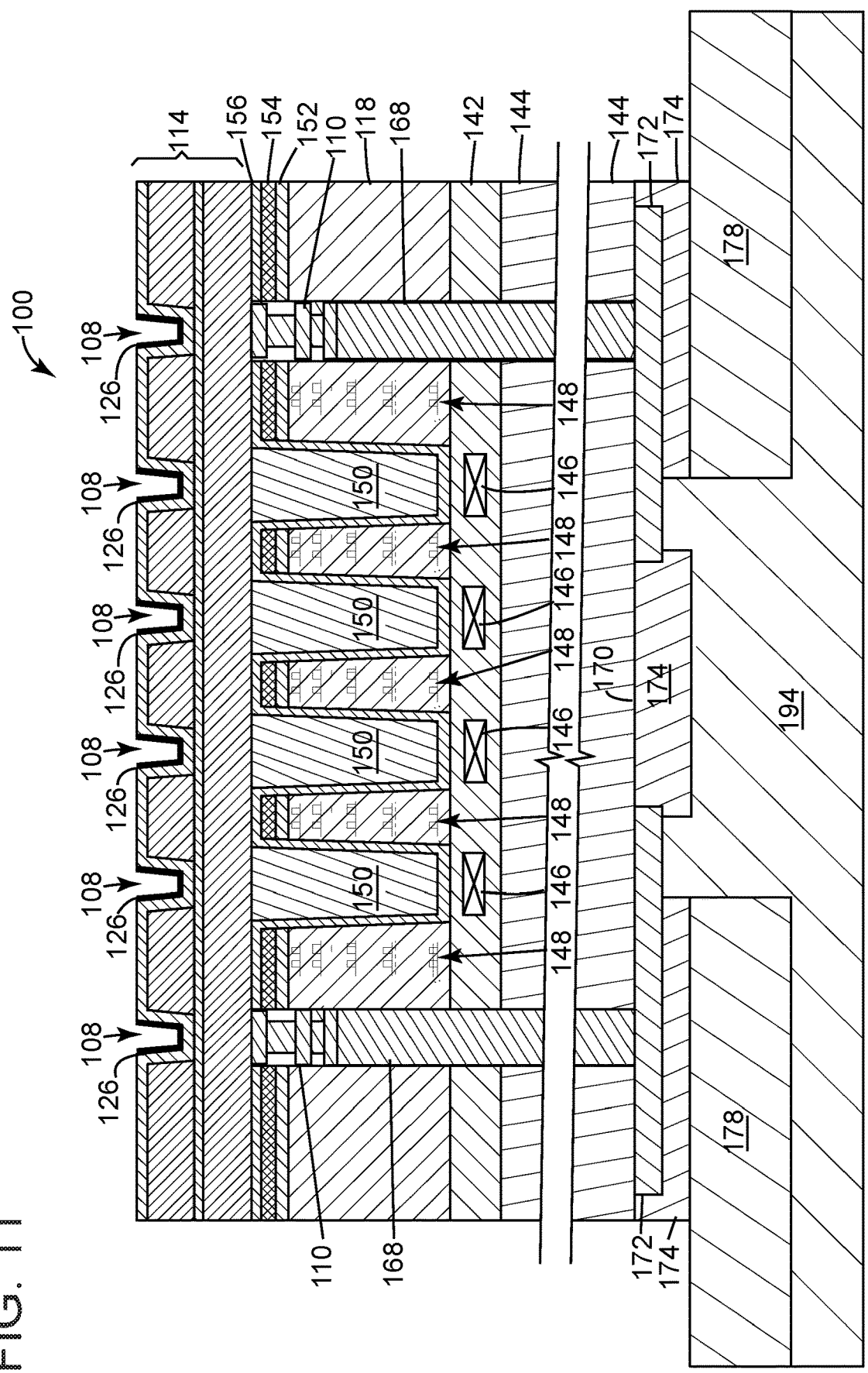
FIG. 11 is a simplified cross sectional view of the sensor system of FIG. 10, wherein the image sensor structure includes a hydrogel layer disposed within the nanowells in accordance with one example disclosed herein.

Referring to FIG. 11, thereafter in the process flow, a hydrogel layer 126 is disposed in the nanowells 108. The hydrogel layer may be composed of any suitable polymers, such as silane-free acrylamide (SFA) polymer, methacrylamide, hydroxyethly methacrylate or N-vinyl pyrrolidinone. Several processes may be utilized for this overall deposition process, including, but not limited to:

spin coating the top layer 112 of the passivation stack 114 with hydrogel 126;
curing the hydrogel 126; and
CMP down the hydrogel 126 so that it is disposed at least substantially on the inner surfaces of the nanowells 108.

Referring to FIG. 12, thereafter in the process flow, the flow cell 102 is disposed upon the top layer 112 of the passivation stack 114 to form the flow channel 106 therebetween, such that the flow channel is disposed over the array of nanowells 108 and the bond pads 110. This can be done by any suitable bonding processes, such as adhesive bonding or other bonding processes.

Referring to FIG. 13, thereafter in the process flow, the temporary protective layer 194 can be removed to expose the $2^{nd}$ portion 182 of the RDL 172. This can be done by any suitable removal processes, such as resist stripping or wet or dry etching.

Thereafter wires 180 may be bonded to the $2^{nd}$ portion 182 of the RDL 172, such that the bonded wires 180 are in electrical contact with the RDL 172 through wire bonds 184. This may be done by forming a eutectic metal bond through wire bonding, by solder bump bonding to form a solder bump wire bond 184 or by using other wire bonding processes.

Referring to FIG. 14, thereafter in the process flow, the $2^{nd}$ environmental protection layer 186 is disposed over the $2^{nd}$ portion 182 of the RDL 172. The $2^{nd}$ environmental protection layer 186 and the $1^{st}$ environmental protection layer 174 entirely covering the RDL 174. This may be done by any suitable deposition processes, such as CVD or PVD.

The $1^{st}$ and $2^{nd}$ environmental protection layer 174, 186 also stabilize and protect the wires 180 and wire bonds 184 attached to the RDL 174. Additionally, the deposition of the $2^{nd}$ environmental protection layer completes the formation of the sensor system 100.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

Although the foregoing examples have been described by reference to specific examples, it should be understood that numerous changes may be made within the spirit and scope of the inventive concepts described. Accordingly, it is intended that the examples not be limited to the described examples, but that it have the full scope defined by the language of the following claims.

What is claimed is:

1. A system comprising:
   an image sensor structure comprising:
      an image layer disposed over a base substrate,
      a device stack disposed over the image layer,
      a bond pad disposed in the device stack,
      a passivation stack disposed over the device stack and the bond pad,
      an array of nanowells disposed in a top layer of the passivation stack,
      a through-silicon via (TSV) in electrical contact with the bond pad, the TSV extending through the base substrate, and
      a redistribution layer (RDL) disposed on a bottom surface of the base substrate, the RDL in electrical contact with the TSV; and
   a flow cell disposed upon the top layer of the passivation stack to form a flow channel therebetween;
   wherein the flow channel is disposed over the array of nanowells and extends over the bond pad;
   wherein the passivation stack is disposed between the flow channel and the bond pad.

2. The system of claim 1, comprising:
   a first ($1^{st}$) environmental protection layer disposed over a $1^{st}$ portion of the RDL;
   mechanical support structures disposed over the $1^{st}$ environmental protection layer; and
   wires bonded in electrical contact to a second ($2^{nd}$) portion of the RDL.

3. The system of claim 2, comprising:
   a $2^{nd}$ environmental protection layer disposed over the $2^{nd}$ portion of the RDL;
   wherein the $1^{st}$ and $2^{nd}$ environmental protection layers cover the entire RDL.

4. The system of claim 1, wherein the bond pad is a plurality of bond pads over which the flow channel is disposed.

5. The system of claim 1, wherein the passivation stack comprises:
   a $1^{st}$ passivation layer disposed over the device stack and the bond pad; and
   a $1^{st}$ chemical protection layer disposed over the $1^{st}$ passivation layer.

6. The system of claim 5, wherein the passivation stack comprises:
   a $2^{nd}$ passivation layer disposed over the $1^{st}$ chemical protection layer; and
   a $2^{nd}$ chemical protection layer disposed over the $2^{nd}$ passivation layer.

7. The system of claim 1, comprising:
   an array of light detectors disposed in the image layer; and
   an array of light guides disposed in the device stack, each light guide associated with at least one light detector of the array of light detectors.

8. The system of claim 7, wherein the passivation stack comprises a bottom surface in direct contact with a top surface of the light guides.

9. The system of claim 1, wherein the flow cell comprises:
a flow cell lid affixed to flow cell sidewalls, the flowcell sidewalls being bonded to the top layer of the passivation stack;
wherein the flowcell channel is formed by the flow cell lid, flow cell sidewalls and top layer of the passivation stack.

10. The system of claim 1, comprising:
a light shield layer disposed between the device stack and the passivation stack;
wherein, the bond pad extends through the light shield layer.

11. The system of claim 1, wherein a top surface of the bond pad is disposed below a bottom surface of the passivation stack.

12. The system of claim 1, wherein a top surface of the bond pad is in direct contact with a bottom surface of the passivation stack.

13. The system of claim 1, wherein an entire top surface of the bond pad is in direct contact with a bottom surface of the passivation stack.

14. A system comprising:
an image sensor structure comprising:
an image layer disposed over a base substrate, the image layer comprising an array of light detectors disposed therein,
a device stack disposed over the image layer,
a plurality of bond pads disposed in the device stack,
an array of light guides disposed in the device stack,
a passivation stack disposed over the device stack and the plurality of bond pads,
an array of nanowells disposed in a top layer of the passivation stack,
through-silicon via (TSV) in electrical contact with the bond pads of the plurality of bond pads, the TSV extending through the base substrate, and
a redistribution layer (RDL) disposed on a bottom surface of the base substrate, the RDL in electrical contact with the TSV; and
a flow cell disposed upon the top layer of the passivation stack to form a flow channel therebetween;
wherein the flow channel is disposed over the array of nanowells and extends over the plurality of bond pads;
wherein the passivation stack is disposed between the flow channel and the plurality of bond pads.

15. The system of claim 14, comprising:
a $1^{st}$ environmental protection layer disposed over a $1^{st}$ portion of the RDL;
mechanical support structures disposed over the $1^{st}$ environmental protection layer;
wires bonded in electrical contact to a $2^{nd}$ portion of the RDL; and
a $2^{nd}$ environmental protection layer disposed over the $2^{nd}$ portion of the RDL;
wherein the $1^{st}$ and $2^{nd}$ environmental protection layers cover the entire RDL.

16. The system of claim 14, wherein the passivation stack comprises:
a $1^{st}$ passivation layer disposed over the device stack and the plurality of bond pads; and
a $1^{st}$ chemical protection layer disposed over the $1^{st}$ passivation layer.

17. The system of claim 16, wherein the passivation stack comprises:
a $2^{nd}$ passivation layer disposed over the $1^{st}$ chemical protection layer; and
a $2^{nd}$ chemical protection layer disposed over the $2^{nd}$ passivation layer.

18. The system of claim 14, wherein a top surface of each bond pad of the plurality of bond pads is in direct contact with a bottom surface of the passivation stack.

19. The system of claim 14, wherein an entire top surface of each bond pad of the plurality of bond pads is in direct contact with a bottom surface of the passivation stack.

* * * * *